(12) United States Patent
Fang

(10) Patent No.: US 9,604,845 B2
(45) Date of Patent: Mar. 28, 2017

(54) METHODS OF FORMING MICROSTRUCTURE AND ELECTRONIC DEVICE HAVING MOVEABLE COMPONENT

(71) Applicant: STMicroelectronics, Inc., Coppell, TX (US)

(72) Inventor: Ming Fang, Plano, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/873,091

(22) Filed: Oct. 1, 2015

(65) Prior Publication Data

US 2016/0016792 A1 Jan. 21, 2016

Related U.S. Application Data

(62) Division of application No. 12/979,160, filed on Dec. 27, 2010, now Pat. No. 9,174,835.

(51) Int. Cl.
*H01L 21/00* (2006.01)
*B81C 1/00* (2006.01)
*B81B 7/00* (2006.01)

(52) U.S. Cl.
CPC ........ *B81C 1/00666* (2013.01); *B81B 7/0029* (2013.01); *B81C 1/0019* (2013.01); *B81B 2203/0181* (2013.01); *B81C 2201/0169* (2013.01); *B81C 2201/112* (2013.01)

(58) Field of Classification Search
CPC .......... B81B 7/0029; B81B 2203/0181; B81C 1/0019; B81C 1/00666; B81C 2201/0169; B81C 2201/112
See application file for complete search history.

(56) References Cited

U.S. PATENT DOCUMENTS

| | | | |
|---|---|---|---|
| 5,593,924 A | 1/1997 | Apte et al. | |
| 5,828,131 A | 10/1998 | Cabral, Jr. et al. | |
| 5,981,367 A | 11/1999 | Gonzalez | |
| 6,121,139 A | 9/2000 | Chang et al. | |
| 6,171,879 B1 | 1/2001 | Chan et al. | |
| 6,891,655 B2 | 5/2005 | Grebinski et al. | |
| 7,042,619 B1 | 5/2006 | McGinley et al. | |
| 2002/0171150 A1 | 11/2002 | Rudhard | |
| 2008/0237756 A1 | 10/2008 | Partridge et al. | |
| 2009/0284823 A1 | 11/2009 | Chen et al. | |
| 2010/0291410 A1 | 11/2010 | Novotny et al. | |

*Primary Examiner* — Duy T Nguyen
(74) *Attorney, Agent, or Firm* — Seed Intellectual Property Law Group LLP

(57) ABSTRACT

A method of manufacturing microstructures, such as MEMS or NEMS devices, including forming a protective layer on a surface of a moveable component of the microstructure. For example, a silicide layer may be formed on a portion of at least four different surfaces of a poly-silicon mass that is moveable with respect to a substrate of the microstructure. The process may be self-aligning.

19 Claims, 11 Drawing Sheets

METHODS OF FORMING MICROSTRUCTURE AND ELECTRONIC DEVICE HAVING MOVEABLE COMPONENT

BACKGROUND

Technical Field

The present disclosure pertains to micro-fabricated structures and, more particularly, to the formation of Micro-Electromechanical Systems (MEMS) and Nano-Electromechanical Systems (NEMS).

Description of the Related Art

Micro-ElectroMechanical Systems (MEMS) refers to microscopic mechanical devices, such as sensors, actuators, and electronics, typically fabricated on or in silicon chips or a silicon substrate using micro-fabrication technology. For example, a MEMS device may comprise a first suspended electrode and a second electrode separated by a submicron opening. MEMS devices may generally comprise moveable components such as mechanical components and may, for example, range in size from a micrometer (a millionth of a meter) to a millimeter (a thousandth of a meter), and can include three-dimensional lithographic features employing various geometries.

Typical applications for MEMS devices and systems include piezoelectrics for printers or bubble ejection of ink, accelerometers to control the deployment of airbags, gyroscopes for dynamic stability control, pressure sensors used in transportation and medical applications, such as car tire pressure sensors and disposable blood pressure sensors, micromirrors used to form displays, optical switching technology for data communications, and heated chambers for fluidic applications.

A related technology is Nano-ElectroMechanical Systems (NEMS), which are similar to MEMS but on a smaller scale, including displacements and forces at the molecular and atomic scales. MEMS, NEMS and nanotechnology facilitate providing mechanical and electrical devices on, for example, a single chip, that may be much smaller, more functional and reliable, and produced at a fraction of the cost of conventional macroscale elements.

BRIEF SUMMARY

In an embodiment, a microstructure comprises: a substrate; and a component moveably secured to the substrate and having a body formed of a first type of material, the body having a second type of material different from the first type of material positioned on at least a portion of at least one surface of the body, the second type of material having more electropositive elements than the first type of material. In an embodiment, the first type of material comprises silicon. In an embodiment, the first type of material comprises poly-silicon. In an embodiment, the second type of material comprises a silicide. In an embodiment, the silicide comprises a metallic material and silicon. In an embodiment, the metallic material comprises titanium. In an embodiment, the metallic material comprises at least one of cobalt, nickel, platinum, tantalum and titanium nitride. In an embodiment, the second type of material comprises the first type of material combined with a third type of material to form the second type of material. In an embodiment, the second type of material is positioned on a plurality of surfaces of the body of the moveable component. In an embodiment, the moveable component comprises a coupling configured to moveably secure the body of the moveable component to the substrate. In an embodiment, the microstructure further comprises a coupling configured to moveable secure the moveable component to the substrate.

In an embodiment, an electronic device comprises: an integrated circuit; and a microstructure coupled to the integrated circuit, the microstructure including: a substrate; a moveable mass formed of a first type of material; means for moveably securing the moveable mass to the substrate; and means for protecting at least a portion of at least one surface of the moveable mass. In an embodiment, the moveable mass comprises a poly-silicon material. In an embodiment, the means for protecting comprises a silicide. In an embodiment, the silicide is a salicide. In an embodiment, the silicide comprises titanium.

In an embodiment, a method comprises: forming a substrate of a microstructure; forming at least one sacrificial region on the substrate; forming a moveable component of a first type of material on the at least one sacrificial region; positioning a second type of material different from the first type of material on at least one exposed surface of the moveable component; and at least partially releasing the moveable component. In an embodiment, the second type of material is more electropositive than the first type of material. In an embodiment, the first type of material is a silicon-based material. In an embodiment, the second type of material is a metallic material. In an embodiment, the method further comprises: annealing the second type of material to the at least one exposed surface of the moveable component to form silicide on the at least one exposed surface of the moveable component. In an embodiment, the annealing occurs before the at least partially releasing. In an embodiment, the positioning is self-aligning. In an embodiment, the method further comprises: positioning material different from the first type of material on another exposed surface of the moveable component; annealing the material different from the first type of material to the another exposed surface of the moveable component; and further releasing the moveable component. In an embodiment, the sacrificial region comprises silicon dioxide.

BRIEF DESCRIPTION OF THE SEVERAL VIEWS OF THE DRAWING(S)

DETAILED DESCRIPTION

Figure 1:
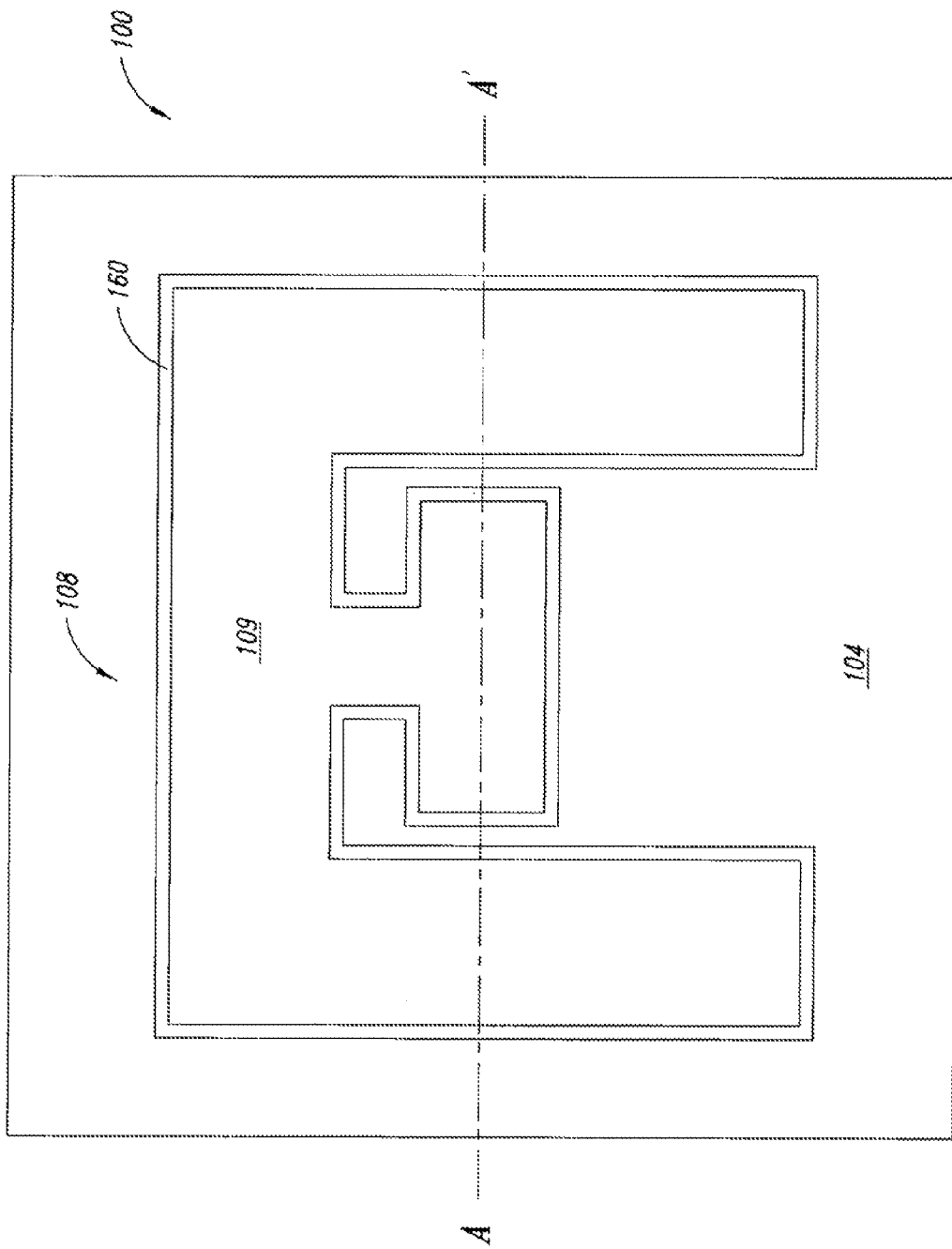
FIG. 1 is a top view of an embodiment of a MEMS device.

In the following description, certain details are set forth in order to provide a thorough understanding of various embodiments of devices, methods and articles. However, one of skill in the art will understand that other embodiments may be practiced without these details. In other instances, well-known structures and methods associated with, for example, substrates, MEMS, NEMS, and fabrication processes, such as salicide processes, alloy deposition processes, thermal treatment processes, etching, annealing, film deposition and removal, processors, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "com-} prises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a rectilinear-shaped feature or element does not mean that a feature or element has a geometrically perfect rectilinear shape.

For convenience, embodiments will be described in terms of MEMS devices. The concepts disclosed herein also are applicable to other micro-devices and micro-fabricated structures, such as NEMS devices.

FIG. 1 is a top view of an embodiment of a MEMS device 100. The MEMS device 100 has a moveable mass or component 108 secured to a substructure 104. The moveable component 108 has a body 109 and a coating or layer 160 on all or part of one or more surfaces of the moveable component 108. The moveable component 108 is secured to the substructure 104 (and/or to a substrate, see substrate 102 of FIG. 2) and may move with respect to the substructure 104 while remaining secured to the substructure 104.

Figure 6:
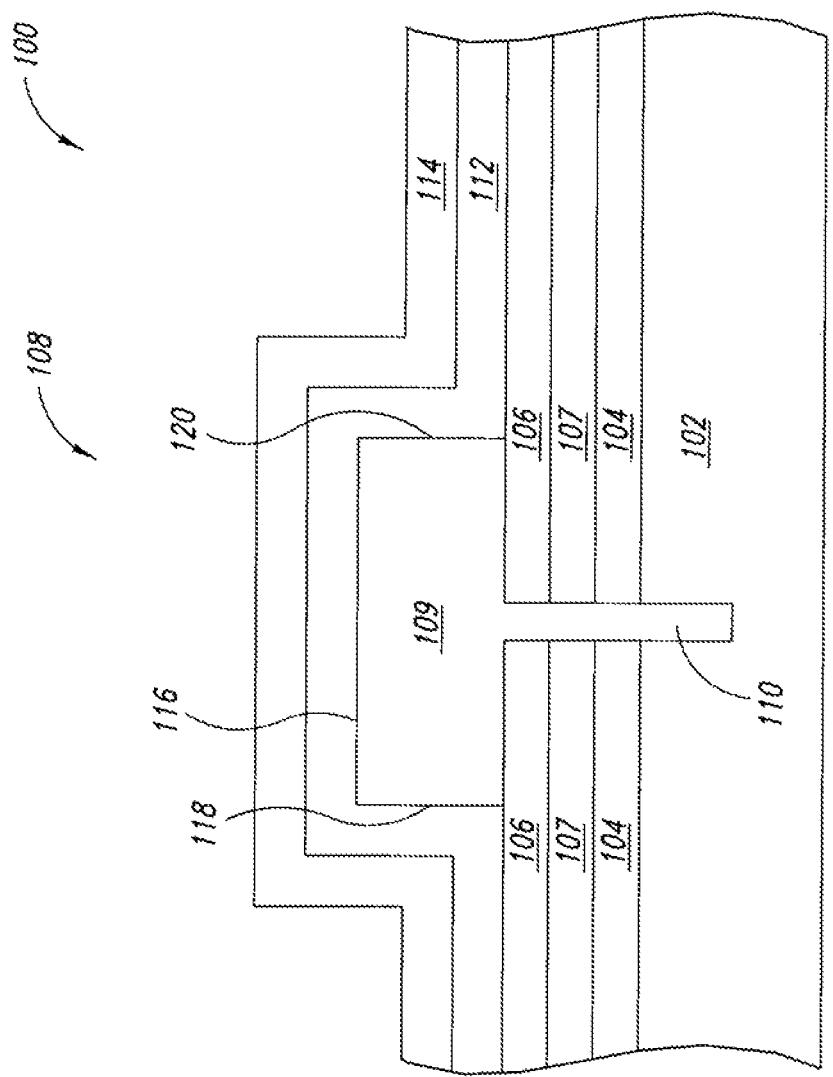
Figure 7:
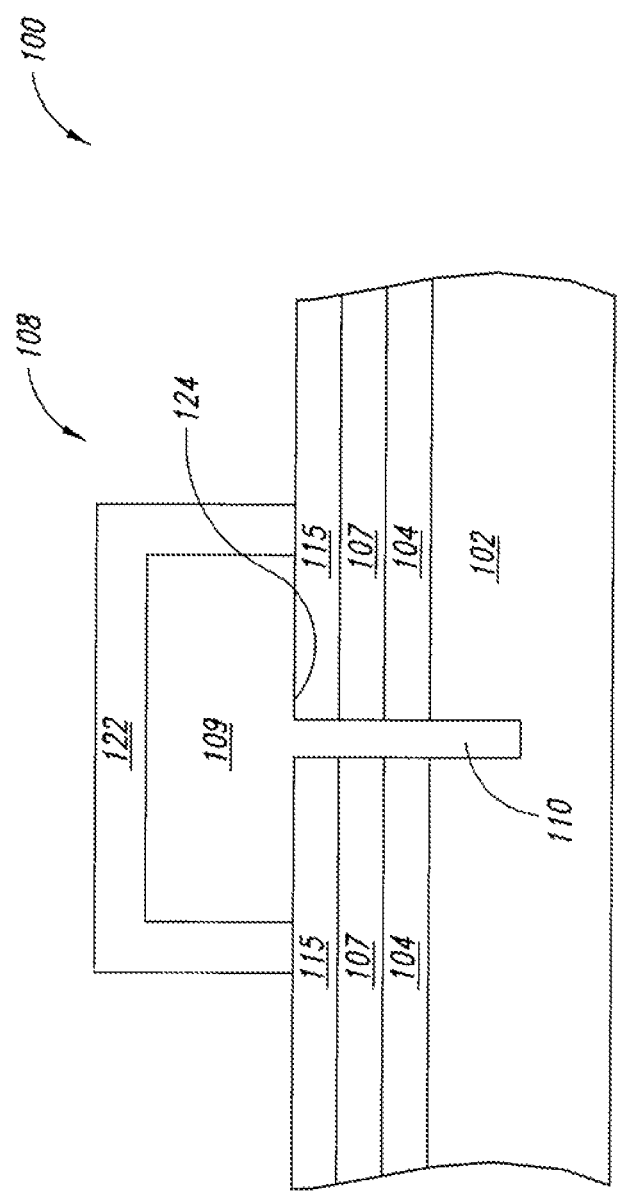
Figure 8:
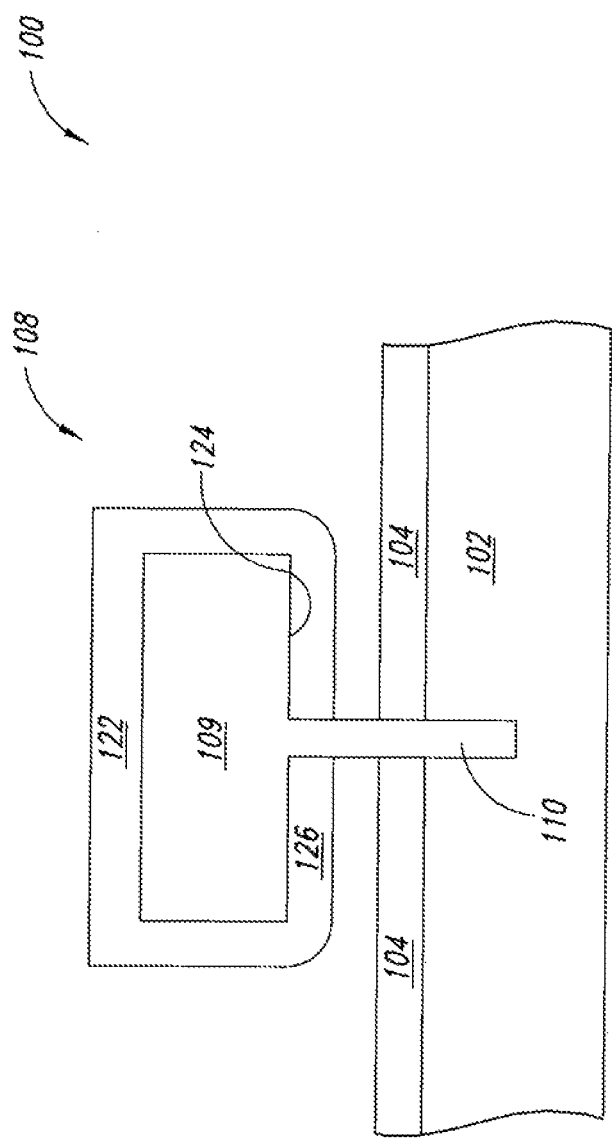
Figure 9:
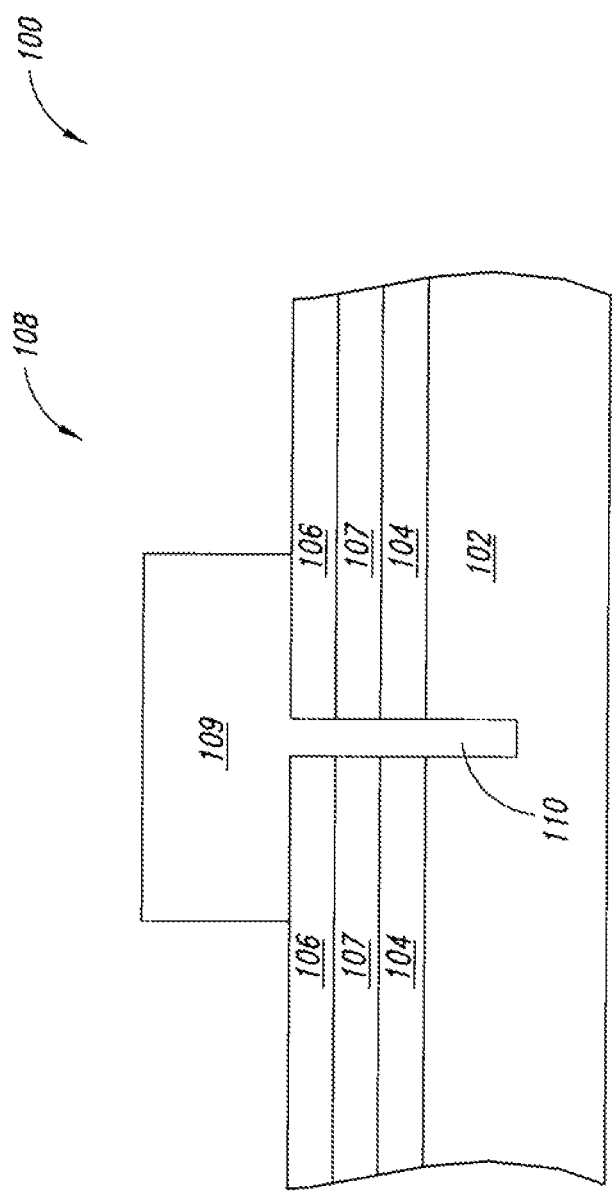
Figure 10:
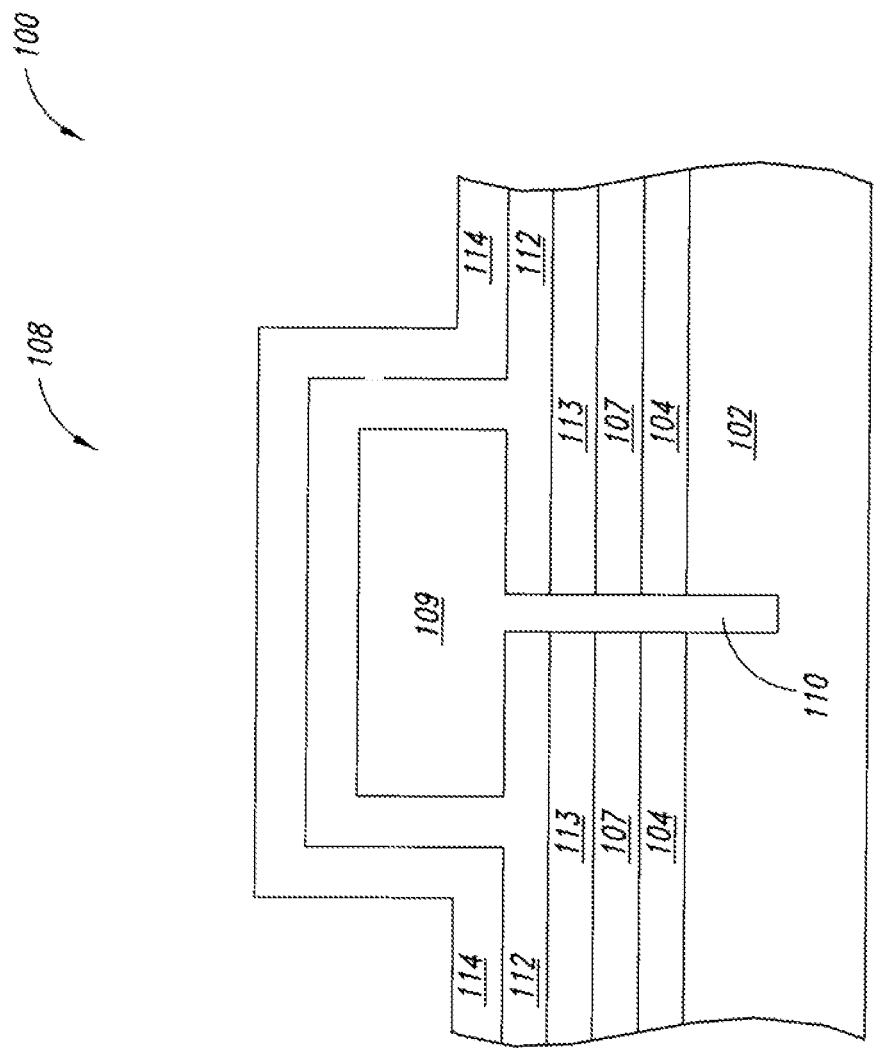
Figure 11:
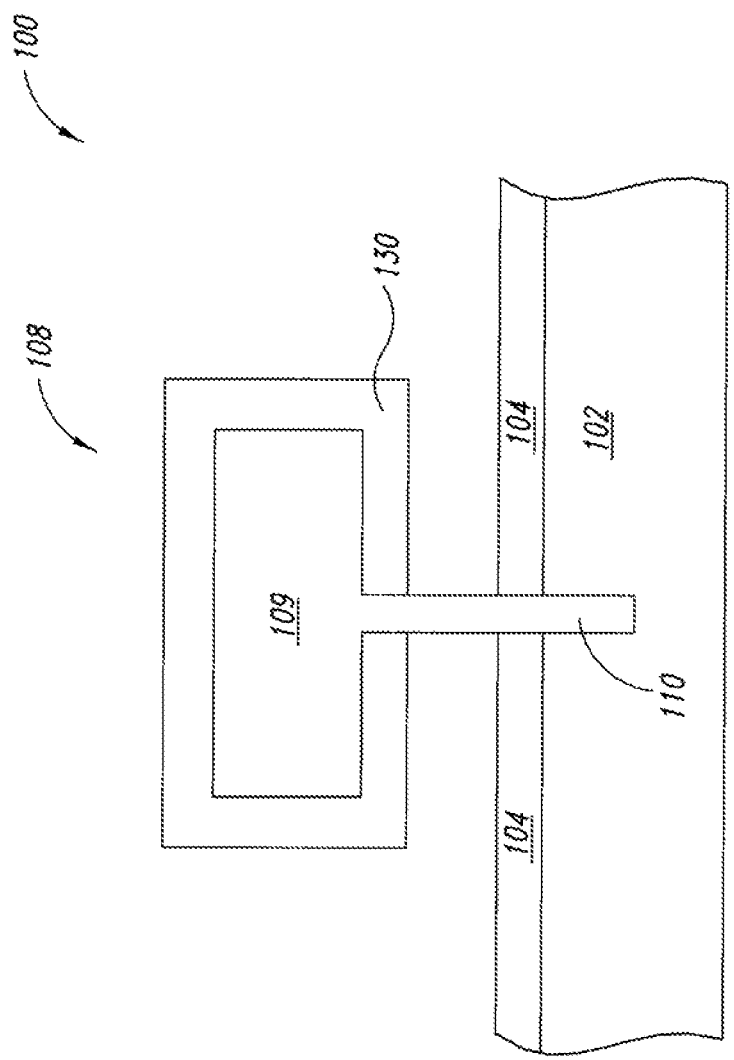

FIGS. 2-5 are side cross-sectional views illustrating an embodiment of a MEMS device 100 similar in at least some respects to the embodiment of FIG. 1 taken along line A-A' during various stages of an embodiment of a manufacturing process. FIGS. 6-8 are side cross-sectional views illustrating another embodiment of a MEMS device 100 similar in at least some respects to the embodiment of FIG. 1 taken along line A-A' during various stages of an embodiment of a manufacturing process. FIGS. 9-11 are side cross-sectional views illustrating another embodiment of a MEMS device 100 similar in at least some respects to the embodiment of FIG. 1 taken along line A-A' during various stages of an embodiment of a manufacturing process.

The MEMS device 100 comprises a substrate 102 that may be formed, for example, of monocrystalline semiconductor material such as silicon. The substrate 102 may be doped with a desired conductivity type, either P-type or N-type. An optional sub-structure 104 is formed on the substrate 102. The sub-structure 104 may comprise, for example, electrodes, passive components, active components, mechanical components, etc., and may comprise mulitple layers, sub-layers and regions. A sacrificial layer 106 is formed, for example deposited or grown, on the sub-structure 104. While the illustrated embodiments are described in terms of layers, regions (such as sacrificial or substructure regions) may be employed. The sacrificial layer 106 may, for example, be a thermal oxide, such as silicon dioxide (SiO2), tetra ethyl ortho silicate (TEOS), borophosphosilicate glass (BPSG), spin-on glass, poly germanium, combinations thereof, etc., or any suitable sacrificial layer that is wholly or partially removable later in the process. For example, a plasma etch chemical vapor deposition (PECVD) technique may be used to deposit the sacrificial layer 106. The sacrificial layer 106 may have various thicknesses, for example, of one to two microns.

A body 109 of a moveable component 108, for example an electrode, a mass, a beam structure, etc. is formed or positioned on the sacrificial layer 106. A coupling element 110, such as an anchor or axis, moveably secures the moveable component 108 to the substrate 102, and may be integral with or secured to the moveable component 108. The moveable component 108 may have various thicknesses, shapes, masses, and may comprise various materials and combinations of materials. These and other features of the moveable component may depend, for example, on the desired features of the MEMS device. For example, the moveable component 108 and the body 109 of the moveable component may comprise various types of materials, such as a silicon-based material, such as poly-silicon, silicon-germanium (SiGe), etc. The thickness, shape, mass, etc., may be determined based, for example, on a desired amount of force to cause the moveable component 108 to deflect, etc.

The moveable component 108 may be, for example, an electrode of a set of capacitively coupled electrodes which may be utilized in a variety of applications, such as accelerometers, temperature and pressure sensors, and gyroscopes. For example, the moveable component 108 may be configured to deflect in response to an acceleration force. A second electrode and appropriate circuitry (not shown) may be configured to detect a change in the capacitance between the two electrodes and signal a detected acceleration force. The moveable component 108 may be a gear or wheel (for example, turning on an axis, such as the anchor 110, or other axis), a cantilever, etc. The moveable component 108 may comprise sub-components that are moveable with respect to each other.

Moveable components of microdevices may be damaged during the manufacturing process or when in use. Moveable components, such as, for example, silicon-based components, may sometimes stick to themselves, to other components, including other moveable components, or break or be damaged during the fabrication process. For example, a releasing process or other etching processes may remove part of or damage a moveable component.

In an embodiment, one or more surfaces of the moveable components may be treated to protect and enhance the moveable components. For example, surfaces of the moveable components may be treated to make them harder, stronger, rougher, smoother, less likely to stick together, etc. Various processes may be used to treat surfaces of the moveable components. For example, silicide processes, salicide processes, alloy deposition processes, or surface thermal treatment processes, etc., or combinations of various processes may be employed to protect and/or enhance one or more surfaces of moveable components. One surface of a moveable component may be treated with one process, for example, while another surface is treated with a different process or left untreated.

Figure 2:
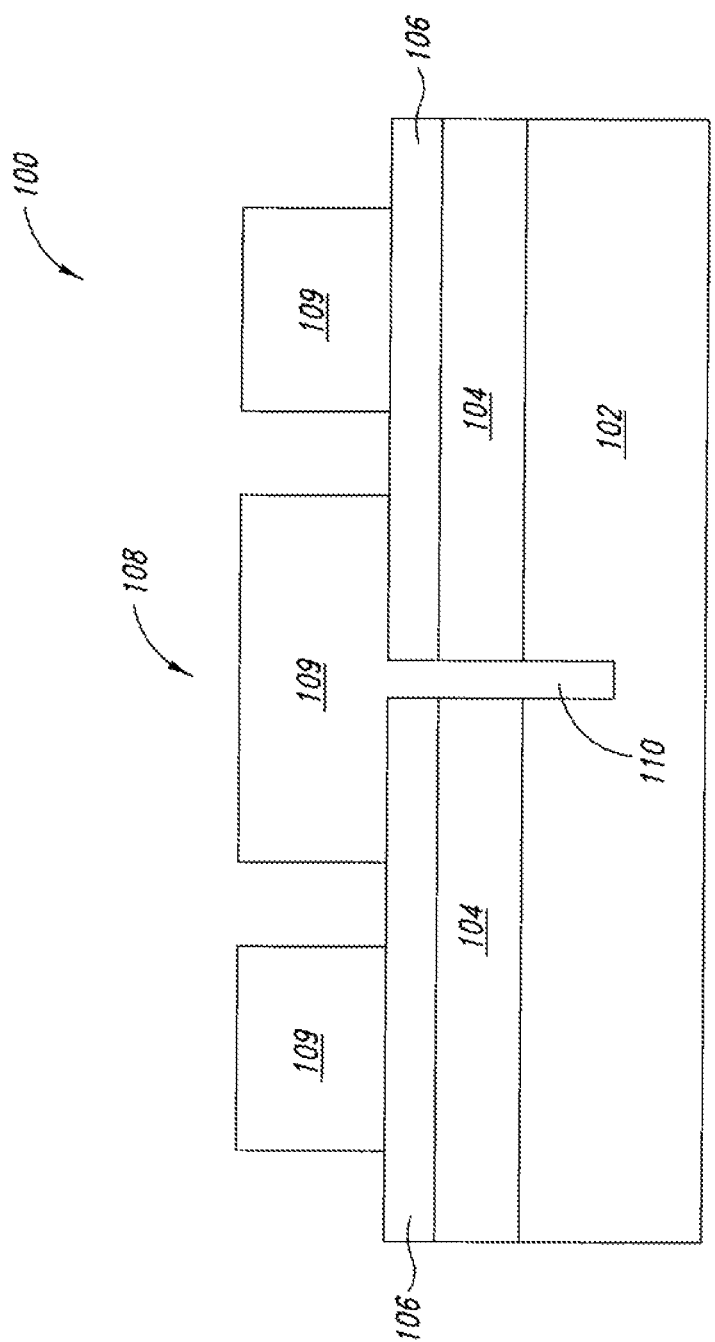
FIG. 2 is a cross-sectional view of an embodiment of a MEMS device.
Figure 3:
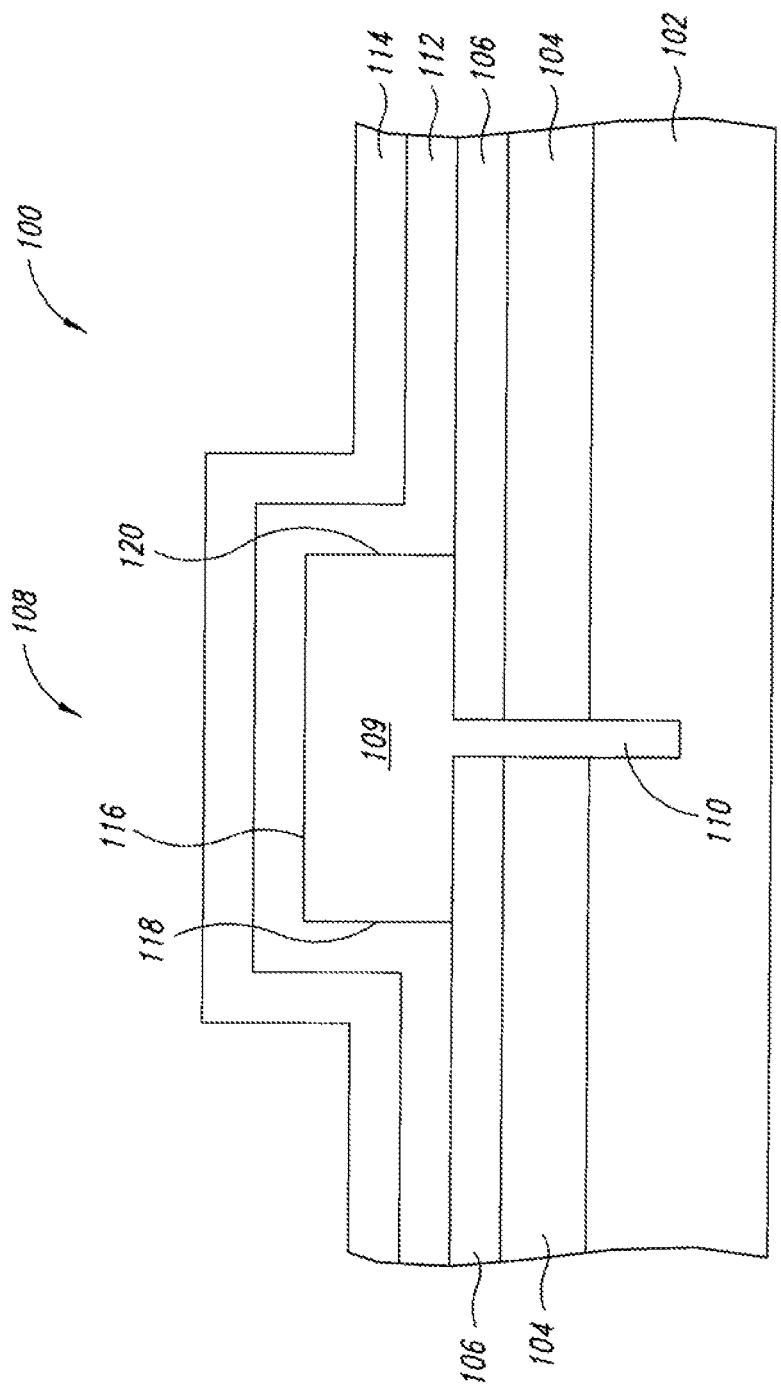
FIGS. 3-11 are expanded cross-sectional views of various embodiments of MEMS devices during various stages of embodiments of fabrication processes.

FIG. 3 is an enlarged illustration of a portion of the MEMS device 100 of FIG. 2. As illustrated in FIG. 3, a first surface treatment layer 112 is applied to the MEMS device 100, covering exposed surfaces 116, 118, 120 of the body 109 of the moveable component 108, as well as exposed portions of an upper surface of the sacrificial layer 106. The surface treatment layer may comprise, for example, a metallic layer, a metallic alloy layer or a protective coating. For example, the first surface treatment layer 112 may comprise a layer of titanium, a layer of titanium nitride or other alloys. In the illustrated embodiment of FIG. 3, the first surface treatment layer 112 comprises a layer of titanium, and an optional second treatment layer 114 is deposited on the first surface treatment layer 112. In the illustrated embodiment, the second treatment layer 114 comprises titanium nitride. The first and second treatment layers 112, 114 may comprise other materials, and additional treatment layers may be employed. For example, materials that bind well with poly-silicon may be used, such as nickel, cobalt, platinum, tungsten, tantalum, other metals, metal alloys, etc., and various combinations of materials.

The thicknesses of the layers may be controlled to obtain desired characteristics of the treated surface of the moveable component. For example, if a layer is too thick, cracking may become an issue, and if a layer is too thin, uniformity may become an issue. The thickness may vary based on the selected material(s) used in the layer(s). In an embodiment, the first treatment layer 112 may have a thickness of, for example, between 300 Angstroms and 600 Angstroms, and the second treatment layer 114 may have a thickness of, for example, between 1000 Angstroms and 1500 Angstroms.

The MEMS device 100 may be subjected to an annealing process, such as, for example, a rapid thermal annealing (RTA) process. For example, the MEMS device or a portion thereof may be exposed to an infrared lamp which heats the moveable component 108 and the treatment layers 112, 114 quickly, causing one or more chemical reactions, such as between the first treatment layer 112 and one or more surfaces 116, 118, 120 of the body 109 of the moveable component 108, between the first and second treatment layers 112, 114 and one or more surfaces 116, 118, 120 of the body 109 of the moveable component 108, between the first treatment layer 112 and the second treatment layer 114, in the first or second treatment layers 112, 114, etc. In an embodiment, temperatures between 750 degrees Celsius and 1100 degrees Celsius may be employed, for example.

Figure 4:
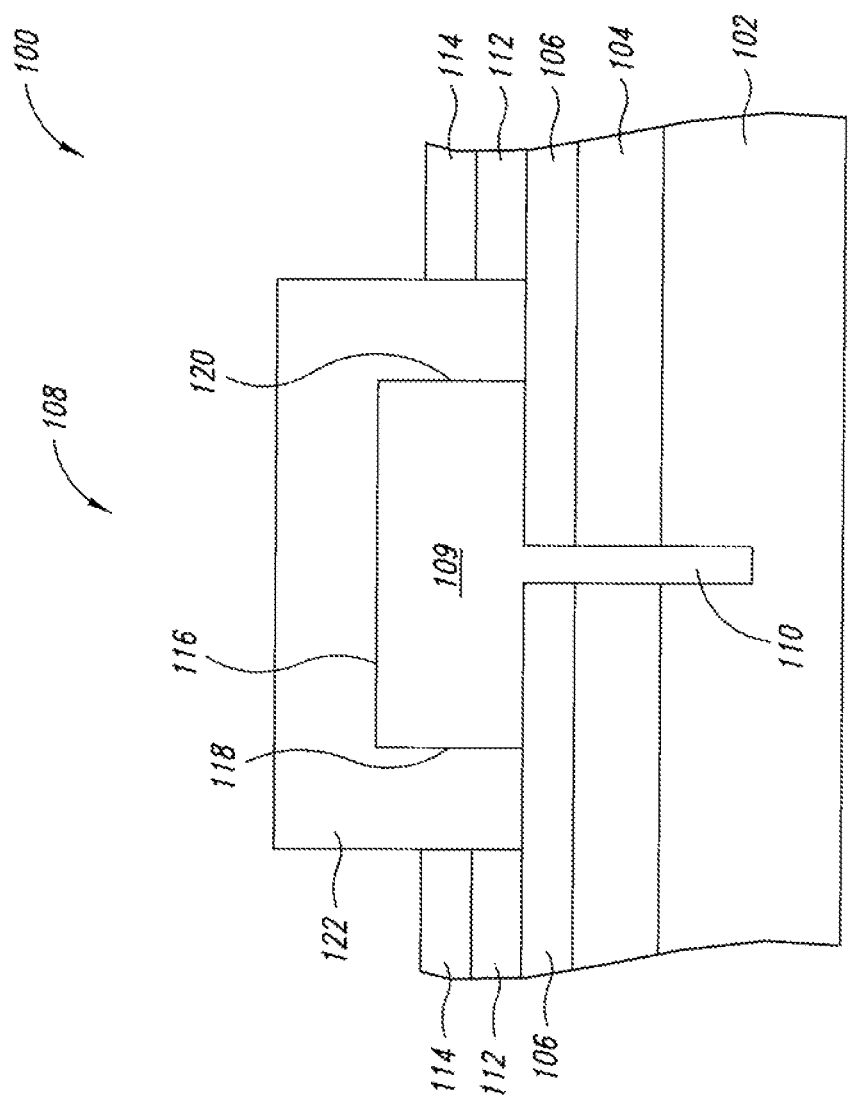

FIG. 4 illustrates an embodiment of the MEMS device 100 of FIG. 3 after an annealing process. In the annealing process of the illustrated embodiment, the first and second treatment layers 112, 114 reacted with the surfaces 116, 118, 120 of the body 109 of the moveable component 108 to form a silicide layer or surface alloy layer 122 on the surfaces 116, 118, 120 of the body 109 of the moveable component 108. The silicide layer 122 is a material with more electropositive elements than the poly-silicon material of the body 109.

The first and second treatment layers did not react with the sacrificial layer 106. This can be achieved, for example, by controlling an activation energy of an annealing process. Titanium will react with poly-silicon at lower energy levels, while higher energy levels are needed for titanium to bond with silicon dioxide. Similar treatment processes may be employed, for example when the various components of the MEMS device are made of other materials. For example, compounds with more electropositive elements than silicon, such as other metals and metal alloys, will react with poly-silicon in a manner similar to titanium, and will not as easily bond with silicon dioxide.

The portions of the first and second treatment layers 112, 114 that did not react to form a silicide may be removed, for example, by washing the MEMS device with water, etc., or etching, etc. The sacrificial layer 106 may also be removed, releasing or partially releasing the moveable component. For example, the MEMS device may be exposed to processes that remove the sacrificial layer. For example, $HF_2$, $H_2O_2$, etc., etching, or other agents or treatments may be employed to remove the sacrificial layer 106. The process as illustrated is a self-aligned silicide process for treating surfaces of a moveable component of a MEMS device is disclosed, and the silicide layers of the MEMS device may be salicide layers.

In some embodiments, treatment layers may react with both the moveable component 108 and the sacrificial layer 106. Excess or undesired silicide may be removed, for example, through masking, etching, etc.

Figure 5:
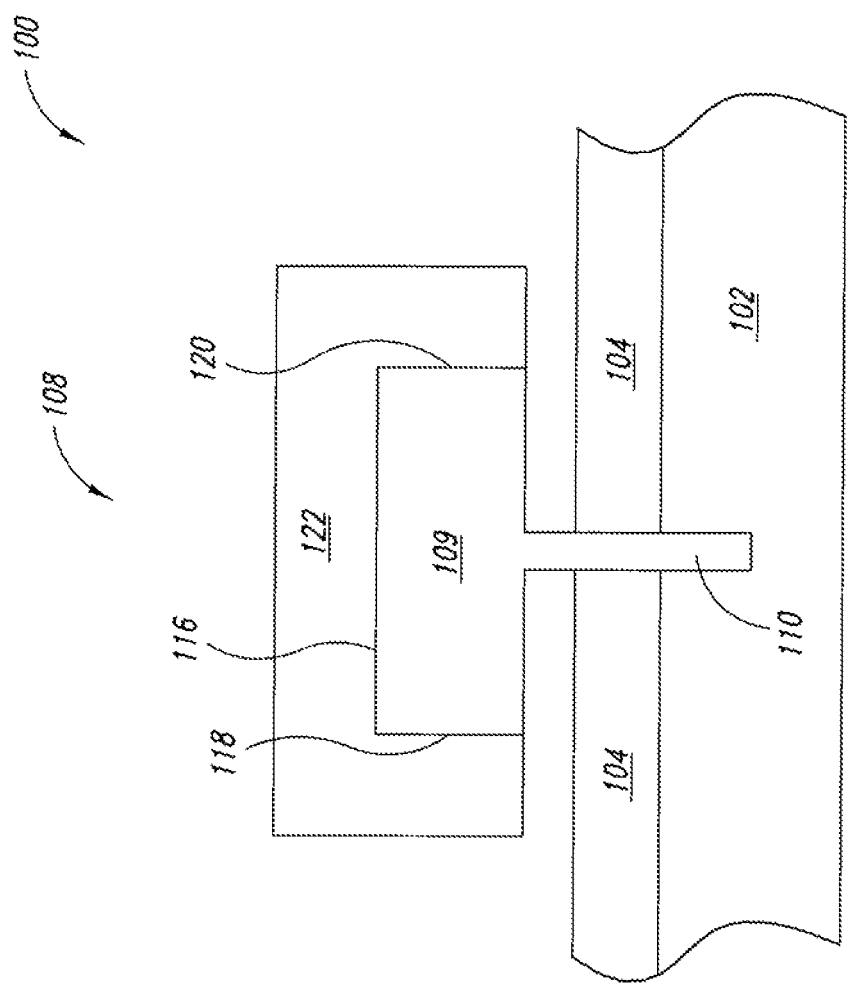

FIG. 5 illustrates an embodiment of a MEMS device 100 of FIG. 4 after excess portions of the treatment layers 112, 114 and the sacrificial layer 106 have been removed. As can be seen, the moveable component 108 has a layer 122 on one or more surfaces 116, 118, 120 of the moveable component 108. The layer may be a passive layer, a protective layer, etc., and may be formed, for example, from a combination of a type of material of the body of the moveable component and another type of material. For example, the body 109 may be of a first type of material (for example, poly-silicon) and the layer 122 may be of a second type of material (for example, a silicide) having more electropositive elements than the first type of material.

FIG. 6 illustrates another embodiment of a MEMS device 100 similar in some respects to the embodiment of FIG. 3 and employing first and second sacrificial layers 106, 107, wherein the first sacrificial layer 106 may be removed without removing the second sacrificial layer 107. For example, the first and second sacrificial layers may comprise different materials which may be released using different processes. The MEMS device 100 of FIG. 6 may be subjected to an annealing process and a releasing process similar to that discussed above with respect to FIGS. 4 and 5, to produce an embodiment of a MEMS device as shown in FIG. 7, with similar reference numbers referring to similar elements. Another treatment layer 115 may be formed or positioned between a surface 124 of the moveable component and the sacrificial layer 107. The MEMS device 100 of FIG. 7 may be again subjected to an annealing process and a releasing process to produce an embodiment of a MEMS device 100 as shown in FIG. 8. The moveable component 108 of the MEMS device 100 of FIG. 8 has a body 109 with a protective coating 122, such as a silicide, on the top and side surfaces, and a protective coating 126, such as a silicide, on a bottom surface 124 of the body 109 of the moveable component.

FIG. 9 illustrates another embodiment of a MEMS device 100 similar in at least some respects to the embodiment of FIG. 3 and employing first and second sacrificial layers 106, 107, wherein the first sacrificial layer 106 may be removed without removing the second sacrificial layer 107. For example, the first and second sacrificial layers may comprise different materials which may be released using different processes. FIG. 10 illustrates the embodiment of a MEMS device 100 of FIG. 9 after the MEMS device 100 has been subjected to a partial release process to remove the first sacrificial layer 106. A third treatment layer 113 is positioned on the second sacrificial layer 107. A first treatment layer 112 is positioned on the third treatment layer 113 and on the body 109 of the moveable component 108. A second treatment layer 114 is positioned on the first treatment layer 112. The first treatment layer 112 may comprise, for example, titanium, and the second and third treatment layers 114, 113 may comprise, for example, titanium nitride. FIG. 11 illustrates the embodiment of a MEMS device 100 of FIG. 10 after the MEMS device 100 has been subjected to an annealing process and a second releasing process. The moveable component 108 of the MEMS device 100 of FIG. 8 has a body 109 with a protective coating 130, such as a silicide, on the exposed surfaces of the body 109 of the moveable component 108.

Embodiments of micro-fabricated structures, as well as embodiments of processes of manufacturing micro-fabricated structures may include additional features not shown in FIGS. 1-11, and may not include all of the features shown in FIGS. 1-11. For example, a moveable component may have more than one coupling or anchor moveably securing the moveable component to a substrate, a MEMS device or other microfabricated structure may have more than one moveable component, more than one optional sub-structure, additional layers and moveable components above, below or beside the illustrated layers and moveable components, and additional sacrificial layers and/or treatment layers may be employed in the process, etc. For example, in the embodiment of FIG. 3, one or more treatment layers, such as a layer of titanium nitride and a layer of titanium, may be formed on the sacrificial layer 106 before the moveable component is formed, to produce an embodiment of a MEMS device similar to the embodiment of FIG. 8. In another example, additional sacrificial layers may be employed to select surfaces or portions of surfaces of the moveable component to be provided with a protective layer. For example, an additional sacrificial layer may be employed so that a salicide is formed only on the top surface 116 of the moveable component of the MEMS device 100 of FIGS. 3-5, or on the top surface 116 and on only a portion of the side surfaces 118, 120 of the body 109 of the moveable component, etc. In another example, in the embodiments of FIGS. 6-8, a release process may be controlled to remove only a portion of a single sacrificial layer 106 to facilitate forming the layer 126 on the surface 124 of the moveable component 108, instead of using two sacrificial layers.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming at least one sacrificial region on a substrate;
   forming a moveable component of a first type of material on the at least one sacrificial region;
   forming a coupling element that moveably secures a body of the moveable component to the substrate;
   positioning a second type of material different from the first type of material on at least a portion of at least one surface of the coupling element and on at least a portion of at least four different surfaces of the body of the moveable component;
   annealing the second type of material to the portion of the at least one surface of the coupling element and to the portion of the at least four different surfaces of the body of the moveable component to form silicide on the portion of the at least one surface of the coupling element and on the portion of the at least four different surfaces of the body of the moveable component, wherein after the annealing of the second type of material, the second type of material has more electropositive elements than the first type of material; and
   at least partially releasing the moveable component by removing a portion of the at least one sacrificial region.

2. The method of claim 1 wherein, prior to the annealing of the second type of material, the second type of material comprises a surface alloy layer.

3. The method of claim 1 wherein the first type of material is a silicon-based material.

4. The method of claim 3 wherein the second type of material includes a metallic material.

5. The method of claim 1 wherein, after the annealing of the second type of material, the second type of material comprises the silicide.

6. The method of claim 1 wherein the annealing occurs after the at least partially releasing.

7. The method of claim 1 wherein the positioning is self-aligning.

8. The method of claim 1, comprising:
   positioning material different from the first type of material on another surface of the moveable component; and
   further releasing the moveable component,
   wherein the annealing includes annealing the material different from the first type of material to the another surface of the moveable component.

9. The method of claim 1 wherein the at least one sacrificial region comprises silicon dioxide.

10. A method, comprising:
    forming at least one substructure on a substrate;
    forming at least one sacrificial region on the at least one substructure;
    forming a moveable component of a first type of material on the at least one sacrificial region;
    forming a coupling element that moveably secures a body of the moveable component to the substrate;
    positioning a second type of material different from the first type of material on at least a portion of at least one surface of the coupling element and on at least a portion of at least four different surfaces of the body of the moveable component; and
    annealing the second type of material to the portion of the at least one surface of the coupling element and to the portion of the at least four different surfaces of the body of the moveable component to form silicide on the portion of the at least one surface of the coupling element and on the portion of the at least four different surfaces of the body of the moveable component, wherein after the annealing of the second type of material, the second type of material has more electropositive elements than the first type of material.

11. The method of claim 10 wherein the at least one substructure comprises at least one electrode.

12. The method of claim 10, comprising removing the at least one sacrificial region.

13. The method of claim 10 wherein, after the annealing of the second type of material, the second type of material comprises the silicide.

14. The method of claim 13 wherein, prior to the annealing of the second type of material, the second type of material comprises a surface alloy layer.

15. A method, comprising:
    forming a substructure on a substrate;
    forming a first sacrificial region on the substructure;

forming a second sacrificial region on the first sacrificial region;

forming a moveable component of a first type of material on the second sacrificial region;

forming a coupling element that moveably secures a body of the moveable component to the substrate;

positioning a second type of material different from the first type of material on at least a portion of at least one surface of the coupling element and on at least a portion of at least four different surfaces of the body of the moveable component;

annealing the second type of material to the portion of the at least one surface of the coupling element and to the portion of the at least four different surfaces of the body of the moveable component to form silicide on the portion of the at least one surface of the coupling element and on the portion of the at least four different surfaces of the body of the moveable component, wherein after the annealing of the second type of material, the second type of material has more electropositive elements than the first type of material; and at least partially releasing the moveable component.

16. The method of claim 15 wherein at least partially releasing the moveable component includes removing the first sacrificial region and removing the second sacrificial region.

17. The method of claim 16 wherein the removing of the first sacrificial region is different from the removing of the second sacrificial region.

18. The method of claim 15 wherein, prior to the annealing of the second type of material, the second type of material comprises a surface alloy layer.

19. The method of claim 15 wherein, after the annealing of the second type of material, the second type of material comprises the silicide.

* * * * *